United States Patent [19]

Sample et al.

[11] Patent Number: 5,887,158
[45] Date of Patent: Mar. 23, 1999

[54] SWITCHING MIDPLANE AND INTERCONNECTING SYSTEM FOR INTERCONNECTING LARGE NUMBERS OF SIGNALS

[75] Inventors: Stephen P. Sample, Mountain View; Terry L. Goode, Sunnyvale, both of Calif.

[73] Assignee: Quickturn Design Systems, Inc., Mountainview, Calif.

[21] Appl. No.: 825,967

[22] Filed: Apr. 4, 1997

Related U.S. Application Data

[63] Continuation of Ser. No. 590,553, Mar. 19, 1996, abandoned, which is a continuation of Ser. No. 481,189, Jun. 7, 1995, abandoned, which is a continuation of Ser. No. 317,162, Oct. 3, 1994, abandoned, which is a continuation of Ser. No. 896,068, Jun. 8, 1992, Pat. No. 5,352,123.

[51] Int. Cl.$^6$ ..................................................... G06F 9/455
[52] U.S. Cl. .............................. 395/500; 439/61; 361/805
[58] Field of Search ........................ 439/61, 65; 324/761, 324/754; 361/802–805; 395/500

[56] References Cited

U.S. PATENT DOCUMENTS

| | | | |
|---|---|---|---|
| 4,686,607 | 8/1987 | Johnson | 361/788 |
| 4,703,394 | 10/1987 | Petit et al. | 361/805 |
| 4,704,599 | 11/1987 | Kimmel et al. | 361/785 |
| 4,876,630 | 10/1989 | Dara | 361/805 |
| 4,914,612 | 4/1990 | Beece et al. | 364/578 |
| 5,036,473 | 7/1991 | Butts et al. | 364/489 |
| 5,062,801 | 11/1991 | Roos | 439/61 |
| 5,109,353 | 4/1992 | Sample et al. | 364/578 |
| 5,329,470 | 7/1994 | Sample et al. | 364/578 |
| 5,352,123 | 10/1994 | Sample et al. | 439/61 |
| 5,448,496 | 9/1995 | Butts et al. | 364/489 |
| 5,452,231 | 9/1995 | Butts et al. | 364/489 |

FOREIGN PATENT DOCUMENTS

| | | |
|---|---|---|
| A1 0 220 677 | 6/1987 | European Pat. Off. . |
| 0 421 960 A1 | 10/1991 | European Pat. Off. . |
| WO 83/04466 | 12/1983 | WIPO . |

OTHER PUBLICATIONS

The Advanced Processor Support System, Scott A. Peterson, Control Data Corporation.

*Primary Examiner*—Kevin J. Teska
*Assistant Examiner*—Dan Fiul
*Attorney, Agent, or Firm*—Lyon & Lyon LLP

[57] ABSTRACT

A physical interconnection architecture for making connections between a plurality of first printed-circuit boards and a plurality of second printed-circuit boards includes a midplane printed-circuit board having a plurality of first connectors oriented in a first direction on one side of the midplane for making connections to the plurality of first printed-circuit boards. The midplane printed-circuit board also has a plurality of second connectors oriented in a second direction orthogonal to the plurality of first connectors on the other side of the midplane. The connectors are positioned such that connection pins on the plurality of first connectors and plurality of second connectors in regions of intersection are double-ended pins common to both. The remaining connection pins of the plurality of first connectors are single-ended connection pins which are connected to the single-ended connection pins of the plurality of second connectors via conductive traces on the midplane printed-circuit board.

8 Claims, 8 Drawing Sheets

SWITCHING MIDPLANE AND INTERCONNECTING SYSTEM FOR INTERCONNECTING LARGE NUMBERS OF SIGNALS

This is a continuation application of application Ser. No. 08/590,553, filed on Mar. 19, 1996, now abandoned which is a continuation application of prior application Ser. No. 08/481,189, filed on Jun. 7, 1995, now abandoned which is a continuation of prior application Ser. No. 08/317,162 filed on Oct. 3, 1994, now abandoned which is a continuation of application Ser. No. 07/896,068 filed on Jun. 8, 1992, now U.S. Pat. No. 5,352,123.

BACKGROUND OF THE INVENTION

1. Field of the Invention

The present invention relates to electrical connections for printed-circuit boards in electronic systems. More specifically, the present invention relates to an arrangement for interconnecting large numbers of signals between printed-circuit boards utilizing a midplane printed-circuit board and multiple double-sided connector structure.

2. The Prior Art

It is typical in electronic systems to interconnect signals from a plurality of printed-circuit boards using a backplane structure. In systems requiring a large degree of connectivity between printed-circuit boards, the backplane is often a limiting factor. This is particularly true when the interconnect pattern must be general purpose and reconfigurable, as it is, for example, in massively parallel computers or programmable in-circuit emulators. Current technology limits the number of traces and layers in the backplane and, hence, the amount of interconnect that is feasible.

Systems with crossed connectors have been proposed and built. An example of such a system is disclosed in S. Peterson, APSS—The Advanced Processor Support System, published by Control Data Systems, Bloomington Minn. The system disclosed therein relies on custom connectors.

Hardware emulators have been made before incorporating system level connectivity at the level disclosed herein using conventional backplanes for interconnecting system circuit boards. U.S. Pat. No. 5,036,473 discloses such an arrangement. However, the physical interconnection architecture described therein suffers from the same I/O limitation drawbacks already mentioned.

BRIEF DESCRIPTION OF THE INVENTION

According to a first aspect of the present invention, a physical interconnection architecture for a multi-printed-circuit-board, high-interconnection-count electronic system in which connections must be made between a plurality of first printed-circuit boards and a plurality of second printed-circuit boards includes a midplane printed-circuit board having a plurality of first high-density printed-circuit board connectors mounted on a first face thereof. The plurality of first high-density printed-circuit-board connectors are oriented in a first direction, preferably parallel to one edge of the midplane printed-circuit board and are used to make connections to the first printed-circuit boards.

Each of the first high-density printed-circuit-board connectors includes a plurality of rows of connection pins on a first face thereof for making electrical contact with the midplane printed-circuit board. Each of the first high-density printed-circuit-board connectors also includes a plurality of rows of connection pins on a second opposing face thereof for making electrical contact with conductors of a mating first printed-circuit board connector mounted on one of the first printed-circuit boards to be connected to the midplane printed-circuit board.

A plurality of second high-density printed-circuit board connectors are mounted on a second face of the midplane printed-circuit board. The second high density printed-circuit board connectors are oriented in a second direction, preferably orthogonal to the first high-density printed-circuit-board connectors forming intersections with the first high-density printed-circuit board connectors in a direction perpendicular to the plane of the first and second faces of the midplane printed-circuit board. The second high-density printed-circuit-board connectors are used to make connections to the second printed-circuit boards. Each of the second high-density printed-circuit-board connectors includes a plurality of rows of connection pins on a first face thereof for making electrical contact with the midplane printed-circuit board. Each of the second high-density printed-circuit-board connectors also includes a plurality of rows of connection pins on a second opposing face thereof for making electrical contact with conductors of a mating second printed-circuit board connector mounted on a second printed-circuit board to be connected to the midplane printed-circuit board.

According to a presently preferred embodiment of the invention, both the row and column spacing of the connection pins of both the first and second high-density printed-circuit board-connectors are equal. The first and second high-density printed-circuit board-connectors are positioned such that the connection pins of both which are disposed in the region of intersection of the first and second high-density printed-circuit board-connectors are double-ended connection pins which are common to both the first and second connectors. The remaining connection pins of the first and second connectors are single-ended connection pins. The single-ended connection pins of the first connectors are connected to the single-ended connection pins of the second connectors by conductive traces on the midplane printed-circuit board.

According to a presently preferred embodiment of the invention, the mating first and second printed-circuit board connectors each include a first face having a plurality of rows of connecting-pin mating elements spaced to mate with the connecting pins on the second faces of the first and second high-density printed-circuit-board connectors mounted on the midplane printed-circuit board. Each of the mating first and second printed-circuit board connectors each include a second face, at right angles to the first face, having a plurality of connecting pins corresponding to the plurality of connecting-pin mating elements. The connecting pins of the mating first and second printed-circuit board connectors are for mounting the mating first and second printed-circuit board connectors to first and second printed-circuit boards.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

The interconnection system of the present invention is useful in any application where large numbers of signals must be routed between circuit boards in an electronic system. By way of example only, the present invention will be disclosed in terms of an illustrative application of the principles of the present invention to a hardware emulator system, such as those disclosed in U.S. Pat. Nos. 5,036,473 and 5,109,353. Such systems typically require a high level of interconnectivity between printed-circuit boards, and are therefore instructive applications in which to illustrate the principles of the present invention. These United States Patents are expressly incorporated herein by reference as if fully set forth herein.

Figure 1:
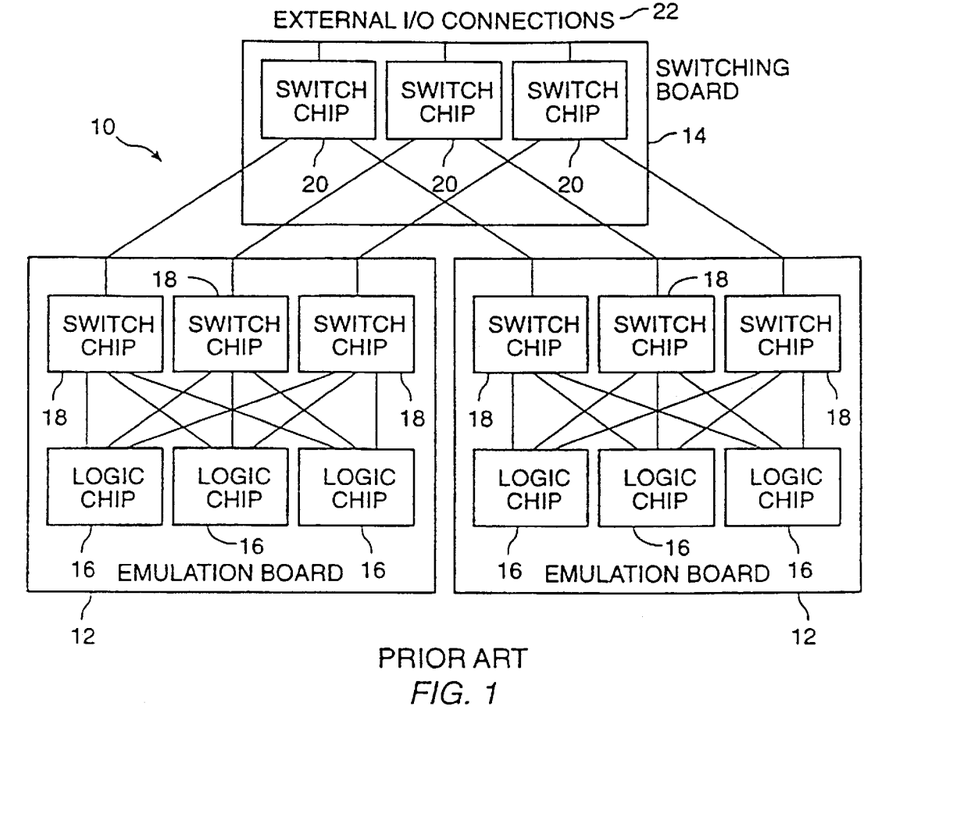
FIG. 1 is a block diagram of an illustrative application for the present invention, showing the degree of system-level connectivity which may be provided by the present invention.

A block diagram of the necessary system level interconnect patterns for a hardware emulation system is shown in FIG. 1. Such a hardware emulation system 10 will include a plurality of emulation printed-circuit boards 12 and a plurality of switching printed-circuit boards 14 (one shown). The emulation printed-circuit boards 12 will each be populated by a plurality of reprogrammable integrated circuits. A first group of the reprogrammable integrated circuits 16 will be logic integrated circuits and will be used for configuring logic blocks in the design to be emulated. A second group of the reprogrammable integrated circuits 18 will be switching integrated circuits and will be used for making interconnections between the logic integrated circuits. Those of ordinary skill in the art will recognize that an actual hardware emulation system may incorporate more integrated circuits and interconnections than are indicated in FIG. 1.

The system block diagram of FIG. 1 also shows switching printed-circuit board 14. The switching printed-circuit boards each contain a plurality of switching integrated circuits 20 and are used to make interconnections between the emulation printed-circuit boards. The switching printed-circuit boards 14 act as a programmable backplane structure and provide external connections through external I/O connectors 22.

In an interconnect structure like that of FIG. 1 (which is known as a partial crossbar interconnect), the I/O pins of each logic chip are divided into proper subsets, using the same division on each logic chip. The pins of each crossbar chip are connected to the same subset of pins from each of every logic chip. Thus, crossbar chip 'n' is connected to subset 'n' of each logic chip's pins. As many crossbar chips are used as there are subsets, and each crossbar chip has as many pins as the number of pins in the subset times the number of logic chips. Each logic chip/crossbar chip pair is interconnected by as many wires, called paths, as there are pins in each sub-set.

Since each crossbar chip is connected to the same subset of pins on each logic chip, an interconnection from an I/O pin in one subset of pins on one logic chip to an I/O pin in a different subset of pins on another logic chip cannot be configured. This is avoided by interconnecting each net using I/O pins from the same subset of pins on each of the logic chips to be interconnected, and configuring the logic chips accordingly.

Since the logic chip can be configured to use any I/O pin may be assigned to the logic configured in a logic chip which is connected to a net, one I/O pin is as good as another.

The general pattern is shown in FIG. 1. Each line connecting a logic chip and a switch chip (also referred to as a crossbar chip) in FIG. 1 represents a subset of the logic chip pins. Each crossbar chip is connected to a subset of the pins of every logic chip. Conversely, this implies that each logic chip is connected to a subset of the pins of every crossbar chip. The number of crossbar chips need not equal the number of logic chips, as it happens to in these examples.

Figure 8:
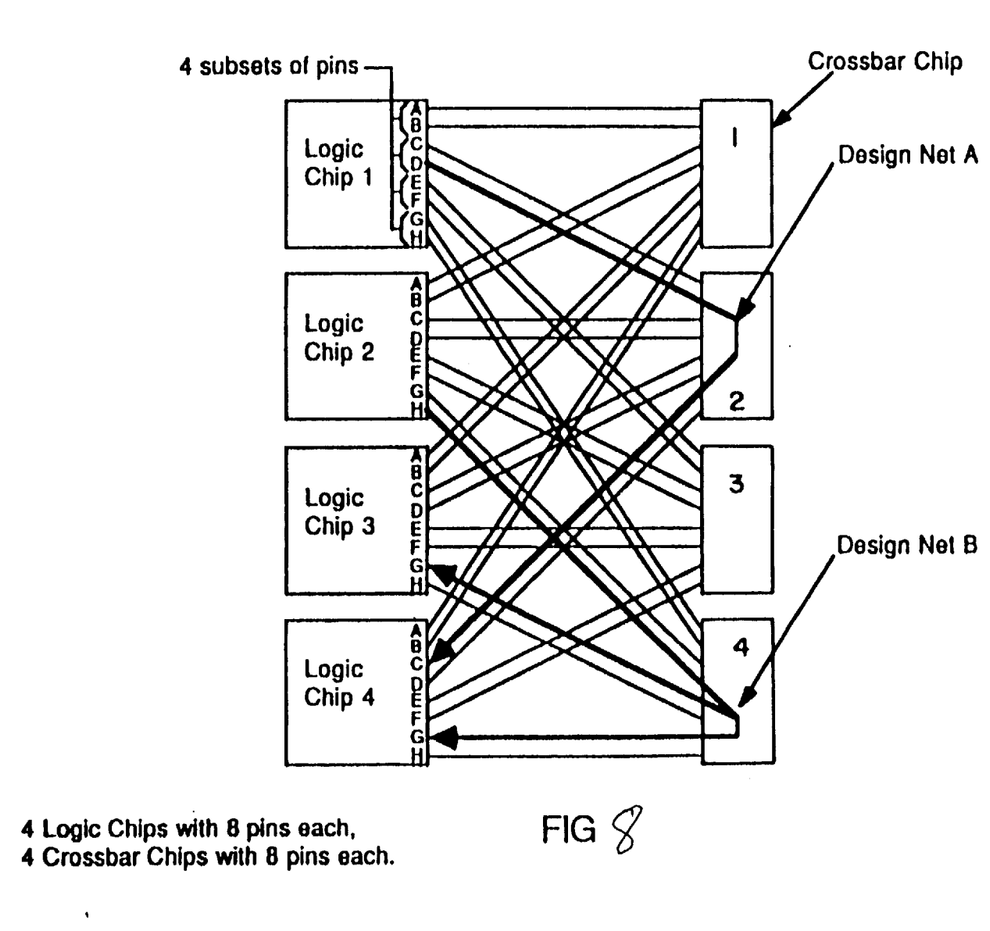
FIG. 8 is a schematic block diagram of a partial cross-bar interconnect system.

FIG. 8 shows an example of interconnecting four logic chips. Four crossbar chips with eight pins each are used. Each crossbar chip connects to the same two pins of each logic chip. Crossbar chip 1 is connected to pins A and B of each of logic chips 1 through 4. Crossbar chip 2 is connected to all pins C and D, chip 3 to all pins E and F, and chip 4 to all pins G and H.

Since any I/O pin may be assigned to the logic configured in logic chip 4 which receives net A, pin C is as good as pin B, which may then be used for some other net. Net A is received by pin C, and the interconnection is accomplished by configuring switch chip 2. Design net B is received by chip 3, pin G, and by chip 4, pin G, but there is no crossbar chip or chips which can interconnect this with the driver on pin F of logic chip 2. Net B is driven by pin H, and the interconnection is accomplished by configuring crossbar chip 4.

The partial crossbar uses the fewest crossbar chips of all crossbar interconnects. Its size increases directly as total number of logic chip pins increases. This is directly related to the number of logic chips and thus logic capacity, which is the desired result. It is fast, in that all interconnections pass through only one interconnect chip. It is relatively easy to use, since it is regular, its paths can be represented in a table, and determining how to establish a particular interconnect is simply a matter of searching that table for the best available pair of paths.

One means of interconnecting logic boards is to reapply the partial crossbar interconnect hierarchically, treating each board as if it were a logic chip, and interconnecting board I/O pins using an additional set of crossbar chips. This partial crossbar interconnects all the boards in a box.

To distinguish among crossbar chips, the partial crossbar interconnect which inter-connects logic chip is called the X-level interconnect, and its crossbar chips are the second group of the reprogrammable integrated circuits 18 seen in FIG. 1. The interconnect which interconnects logic boards is called the Y-level interconnect, and its crossbar chips are the switching integrated circuits 20. In the X-level interconnect, the I/O pins of each logic board are divided into proper subsets, using the same division on each logic board. The pins of each switching integrated circuit 20 are connected to the same subset of pins from each of every logic board. As many switching integrated circuits 20 are used as there are subsets, and each switching integrated circuits 20 has as many pins as the number of pins in the subset times the number of logic boards.

Figure 2:
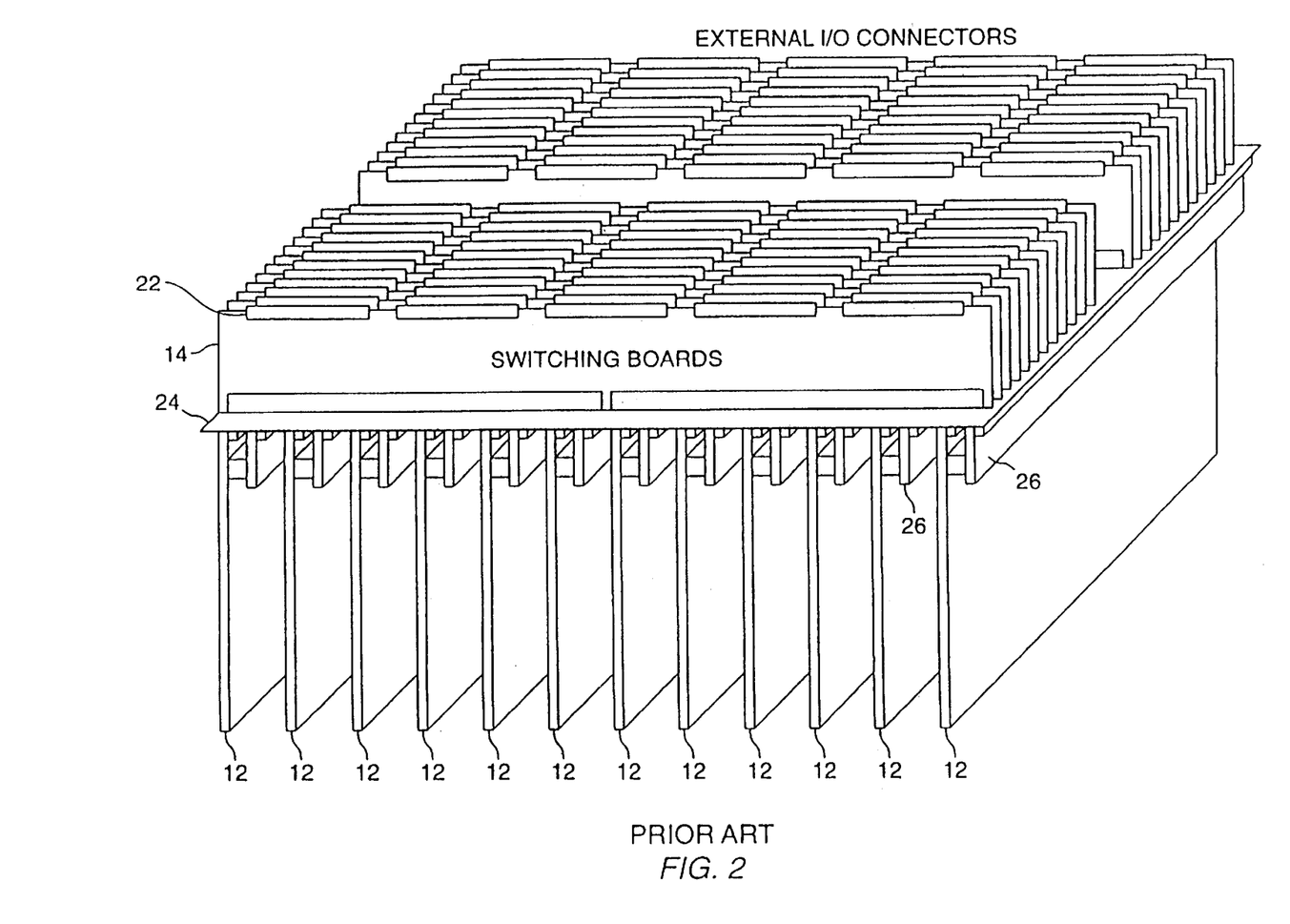
FIG. 2 is a physical diagram showing the interconnection arrangement of emulation printed-circuit boards, switching printed-circuit boards, midplane and external I/O connectors in an illustrative application according to a presently preferred embodiment of the invention.

Referring now to FIG. 2, an exemplary electronic hardware emulator system according to the teachings of the present invention may incorporate twelve emulation printed-circuit boards 12 connected by the programmable backplane structure comprising the switching printed-circuit boards 14 and a midplane printed-circuit board 24. Twenty-four switching printed-circuit boards are shown in a typical disposition at right angles to the emulation printed-circuit boards on the opposite side of the midplane printed-circuit board as shown in FIG. 2.

Figure 3:
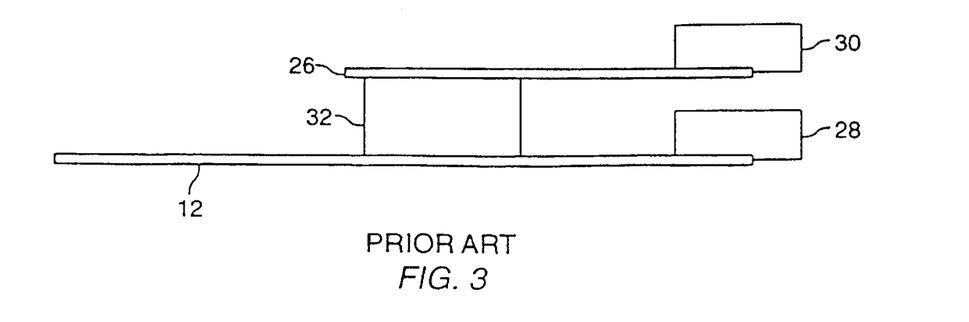
FIG. 3 is a cross-sectional view illustrating a prior art emulation printed-circuit board assembled together with an expansion printed-circuit board to provide the necessary number of connectors to the midplane.

In the hardware emulator application illustrated in FIGS. 1 and 2, the emulation printed-circuit boards require too many I/O signals to fit along one edge of a printed-circuit board using any commercially available connector. It is very desirable to have all the connectors along one edge of the printed-circuit board, however, so that the printed-circuit board is easy to insert and extract during servicing. For this reason, prior art hardware emulation systems have employed expansion printed-circuit boards 26 as shown in FIGS. 2 and 3 to provide interconnectivity for the additional signals needed. When the expansion boards are used, each emulation printed-circuit board assembly takes up two backplane connector slots 28 and 30 and an emulation-board to expansion board connector 32 and has 4-600 pin connectors for a total of 2400 available connections. 1920 of these pins are used for I/O signals. The remainder of the pins are used for power, clock distribution and a data transfer bus. The total number of I/O signals coming from emulation boards is 12* 1920=23,040.

The hardware emulator architecture illustrated in FIGS. 1–3 requires that programmable connections be made among these 23,040 I/O signals using switching integrated circuits. Because it is not practical to place a sufficient quantity of switching integrated circuits directly on a backplane, the switching chips must be placed on separate switching printed-circuit boards as shown in FIG. 2. If all I/O signals were routed to the switching printed-circuit boards, a total of 23,040 nets connecting 46,080 pins would be required to make connections between the switching printed-circuit boards and emulation printed-circuit boards. Conventional printed-circuit board technology does not allow construction of a backplane this complex, especially since most of the board must be drilled with holes for the connector pins.

The present invention comprises a physical technique for implementing the interconnection density required by complex electronic systems such as the hardware emulator system depicted in FIGS. 1–3.

Like the prior art arrangements, in the architecture of the present invention the emulation printed-circuit boards are connected via connectors mounted on a first face of the midplane and the switching printed-circuit boards are connected via connectors mounted on a face of a midplane or backplane board. However, the present invention provides a dramatically more dense interconnect capability than the prior art arrangements.

Figure 4A:
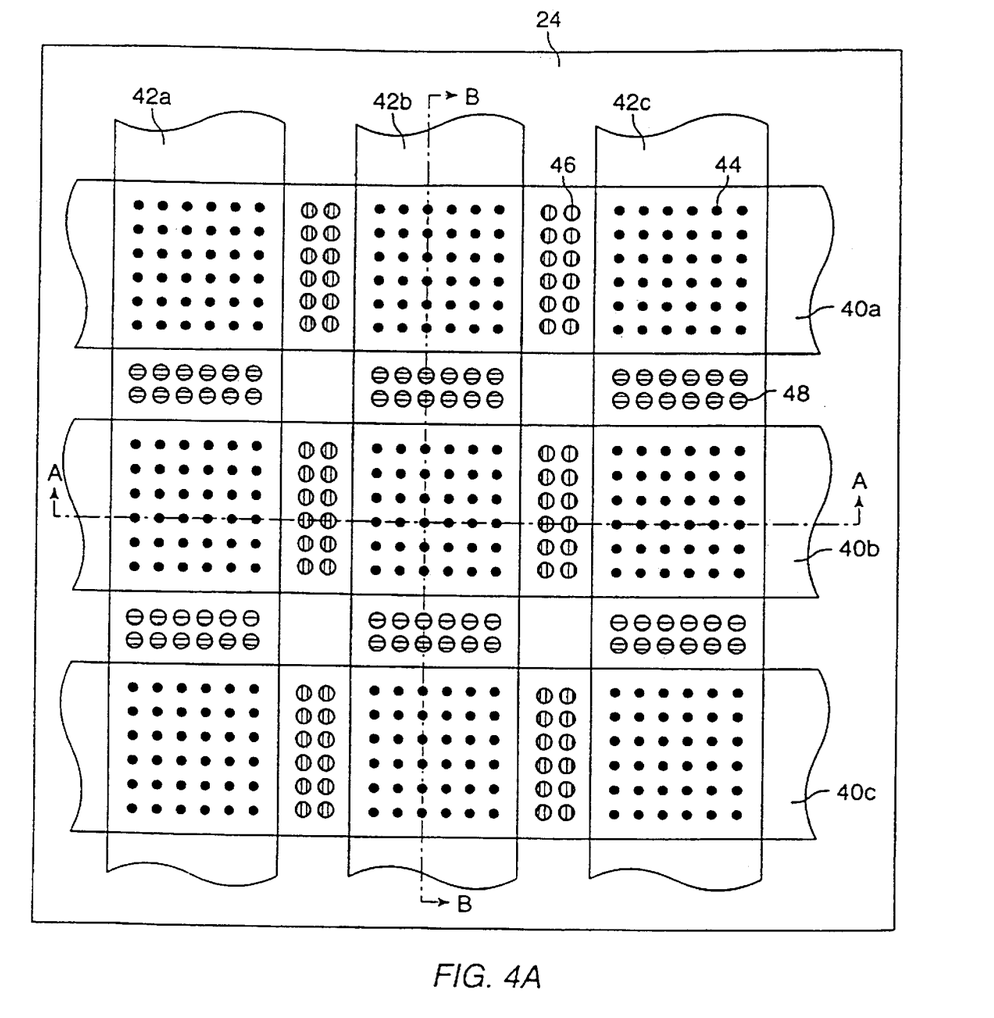
FIG. 4a is a diagram of a midplane printed-circuit board and emulator and switching printed-circuit board connector arrangement according to the present invention, showing both shared connector pass-through pins and single-ended connector pins.

Referring now to FIG. 4a, a midplane printed-circuit board and connector arrangement is shown. FIG. 4a illustrates how the emulation printed-circuit board connectors and switching printed-circuit board connectors are oriented relative to each other on the midplane printed-circuit board and shows the use of common pins between the two connectors, allowing a dramatic increase in interconnect density over prior art arrangements.

Midplane printed-circuit board 24 includes a pattern of holes drilled therein to accept connection pins from a plurality of emulator printed-circuit board connectors 40a–40c, shown in outline form running horizontally across midplane printed-circuit board 24 and a plurality of switching printed-circuit board connectors 42a–42c, shown in outline form running vertically across midplane printed-circuit board 24. While only three each of emulation and switching printed circuit boards are shown in this illustrative embodiment, those of ordinary skill in the art will recognize that depending on the size of the system with which the present invention is used, different numbers of emulation board and switching board connectors may be provided. Connectors having uniformly spaced connector pins in both the X and Y directions are used with the system of the present invention.

According to an already-constructed embodiment of the invention, the emulator printed-circuit board connectors 40a–40c and the switching printed-circuit board connectors 42a–42c are populated with a combination of double-ended pins, single-ended pins and may include empty spaces. As shown in FIG. 4a, six-pin by six-pin regions of emulator printed-circuit board connectors 40a–40c and switching printed-circuit board connectors 42a–42c are common because of the uniform connection pin spacing in both the X and Y directions. These multiple 36-pin locations, each common to one of emulator printed-circuit board connectors 40a–40c and one of switching printed-circuit board connectors 42a–42c connectors may be populated by double-ended connection pins which protrude from both faces of the midplane printed-circuit board 24 and may thus serve as straight-through connections between the two connectors. The signals that these double-ended connection pins carry do not require any trace on the midplane printed-circuit board. The other connection pin locations may be populated by single-ended connection pins. In FIG. 4a, double-ended connection pins are shown as solid circles (exemplary reference numeral 44). Single-ended connection pins on the emulator printed-circuit board connector side of midplane printed-circuit board 24 are shown as vertically cross-hatched circles (exemplary reference numeral 46), and single-ended connection pins on the switching printed-circuit board side of midplane printed-circuit board 24 are shown as horizontally cross-hatched circles (exemplary reference numeral 48). Single-ended connection pins 46 and 48 are identical and are given different reference numerals only to indicate on which face of the midplane printed-circuit board they are mounted.

In an embodiment of the present invention including twelve emulator printed-circuit boards and twelve switching printed-circuit boards, there are 20,736 such double-ended connection pins (24*24*36), which means that 20,736 I/O signals can be routed between emulator printed-circuit boards and switching printed-circuit boards without requiring any traces on the midplane printed-circuit board 24. If the connectors each comprise six 100-pin rows for a total of 600 connection pins per connector, double-ended connection pins account for 432 (72%) of the I/O connections per connector.

Figure 4B:
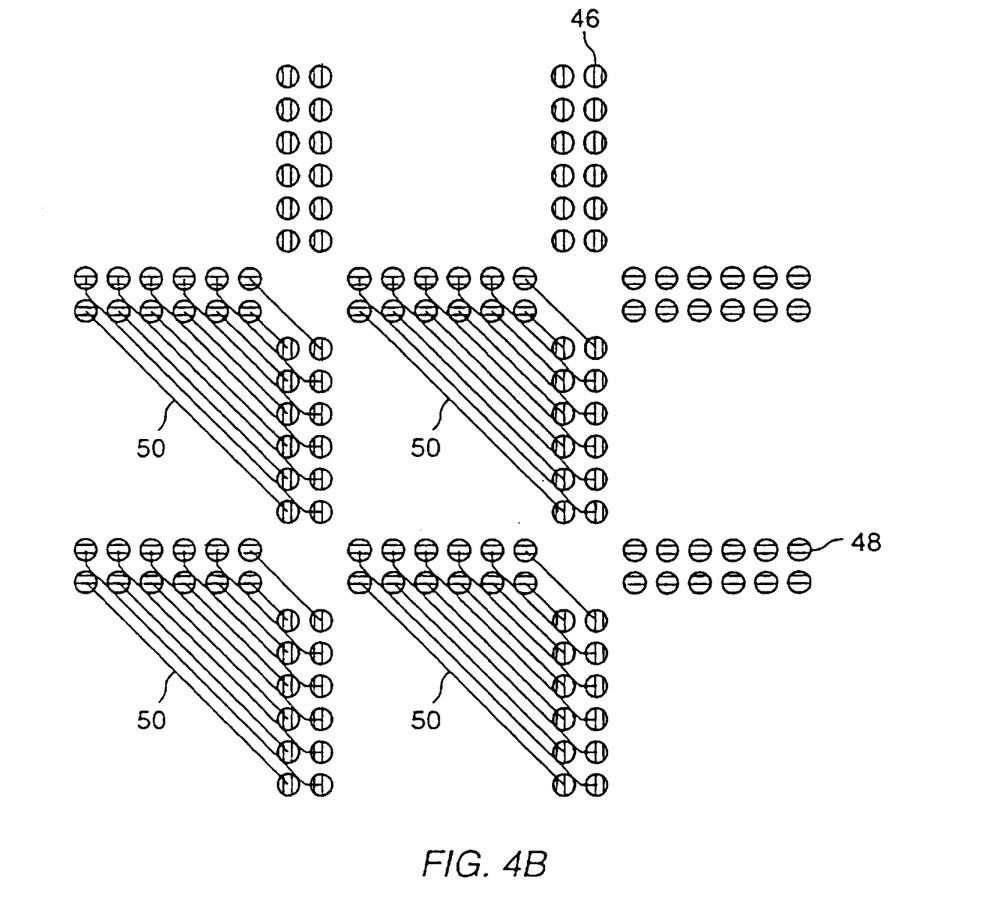
FIG. 4b is a diagram of a portion of the midplane printed-circuit board of FIG. 4a, showing the repetitive conductive trace routing needed in the midplane to connect together single-ended connector pins from the emulator and switching printed-circuit boards.

Referring now to FIG. 4b, it may be seen that there are remaining connector pin positions of the emulator printed-circuit boards and switching printed-circuit boards which do not overlap both connectors and which thus cannot be shared with double-ended connector pins. These connector pins are present in regions of midplane printed-circuit board 24 which lie between adjacent ones of the emulator printed-circuit boards and switching printed-circuit boards. Those of ordinary skill in the art will recognize that adjacent ones of these printed-circuit boards must be spaced apart to accommodate such design considerations as component height, ventilation requirements, etc. In the embodiment illustrated in FIGS. 4a and 4b, inter-connector spacing for both emulator printed-circuit boards and switching printed-circuit boards is shown as two pin positions.

The twelve pins populating these two pin positions for each of the emulator printed-circuit boards and switching printed-circuit boards are single-ended pins which protrude from only the face of the midplane printed-circuit board 24 on which their respective connector is mounted. As illustrated in FIG. 4b, these single-ended connection pins may be connected to one another by twelve short conductive traces 50 disposed in the midplane printed circuit board 24. Since the conductive traces 44 are localized to an area around the intersection between emulation printed-circuit board connectors and switching printed-circuit board connectors, each layer of the midplane printed-circuit board 42 can be used efficiently to make a large number of connections. Long traces that would otherwise be needed on the midplane are moved to the switching printed-circuit boards where there is sufficient room to accommodate both traces and switching chips. Obviously the same technique can be used with different types and numbers of connectors.

Figure 5A:
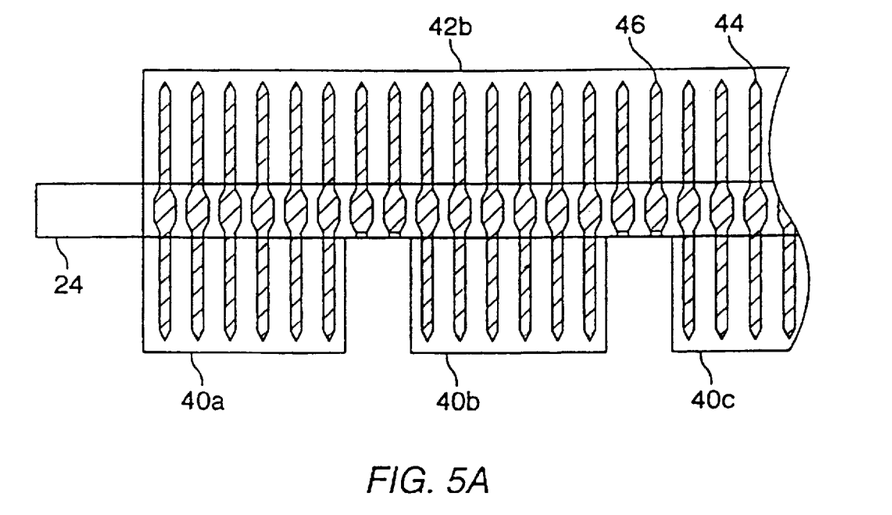
FIG. 5a is a diagram showing a horizontal cross-section through the midplane printed circuit board, several of the emulation printed-circuit board connectors, and one of the switching printed-circuit board connectors.
Figure 5B:
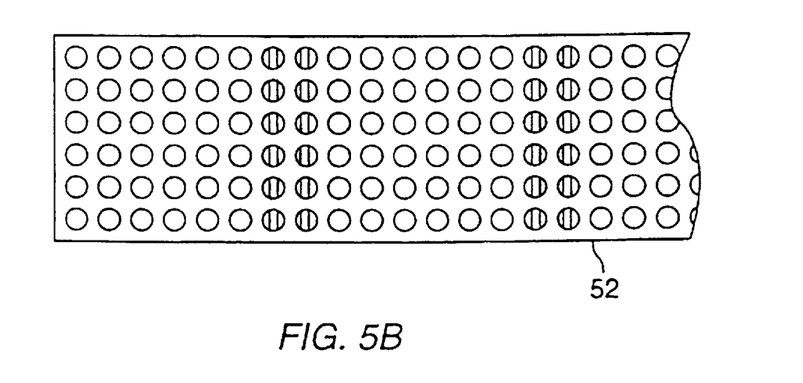
FIG. 5b is a face-on view of a switching printed-circuit board connector prior to assembly onto the midplane printed-circuit board and illustrates how the switching printed-circuit board connector of the present invention may be selectively loaded with single-ended pins or no pins to mate with the midplane printed-circuit board and the emulation printed-circuit board connector.

The midplane printed-circuit board assembly of the present invention may be fabricated by press fitting the pins into the midplane board from one or both of its faces. FIGS. 5a–5b and 6a–6b illustrate this technique. FIG. 5a is a diagram showing a vertical cross-section through the midplane printed circuit board 24 (section B—B through FIG. 4a), emulation printed-circuit board connectors 40a–40c, and one of the switching printed-circuit board connectors 42b. FIG. 5b is a face-on view of a switching printed-circuit board connector prior to assembly onto the midplane printed-circuit board and illustrates how a connector shell 52 for the switching printed-circuit board connector of the present invention may be selectively loaded with a combination of single-ended connection pins and no pins to mate with the midplane printed-circuit board 24 and the emulation printed-circuit board connector.

Figure 6A:
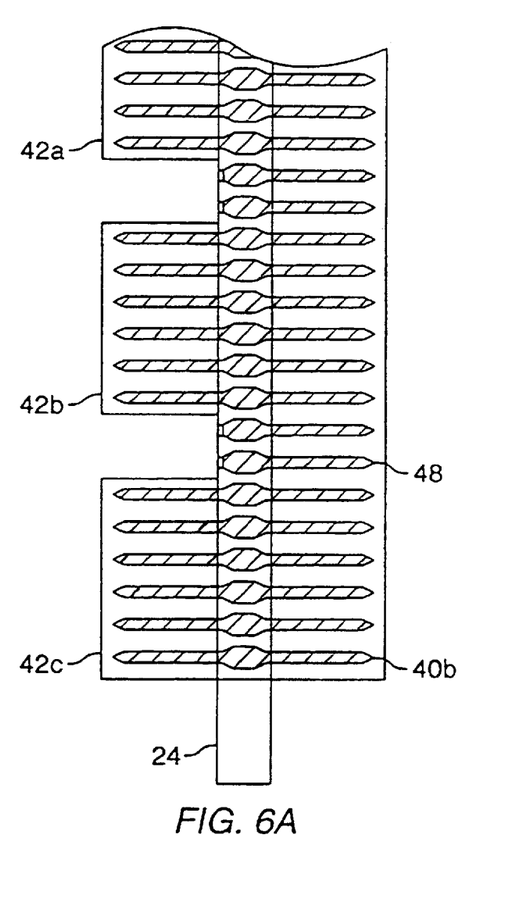
FIG. 6a is a diagram showing a horizontal cross-section through the midplane printed-circuit board, several of the switching printed-circuit board connectors, and one of the emulation printed-circuit board connectors.
Figure 6B:
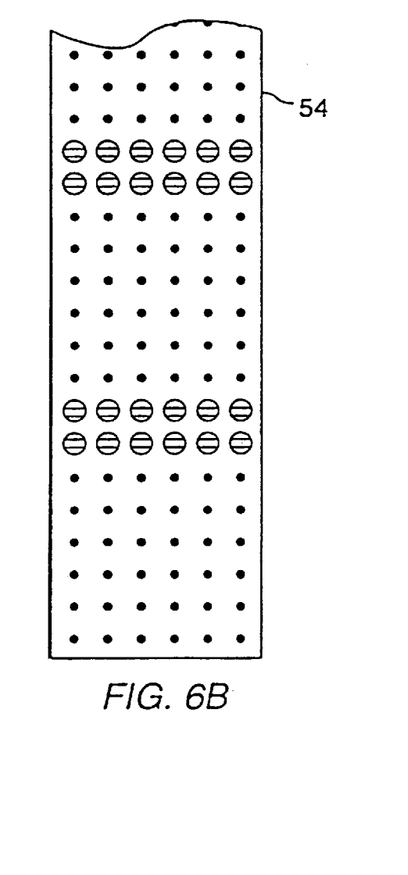
FIG. 6b is a face-on view of an emulation printed-circuit board connector prior to assembly onto the midplane printed-circuit board and illustrates how the emulation printed-circuit board connector of the present invention may be selectively loaded with single-ended pins or double ended pins to mate with the midplane printed-circuit board and the switching printed-circuit board connector.

FIG. 6a is a diagram showing a horizontal cross-section through the midplane printed-circuit board 24 (section A—A through FIG. 4a), switching printed-circuit board connectors 42a–42c, and one of the emulation printed-circuit board connectors 40b. FIG. 6b is a face-on view of an emulation printed-circuit board connector prior to assembly onto the midplane printed-circuit board and illustrates how the emulation printed-circuit board connector shell 54 of the present invention may be selectively loaded with single-ended pins and double-ended pins to mate with the midplane printed-circuit board 24 and the switching printed-circuit board connector.

To assemble the assembly of the present invention depicted in FIGS. 4a–4b, 5a–5b, and 6a–6b, the connector shells 52 and 54 are loaded with single ended and double-ended connection pins and then properly aligned with the plated through holes in the midplane printed-circuit board 24. The pins are then press fit into the holes on midplane printed-circuit board 24 using conventional well-known press-fitted technology.

Figure 7:
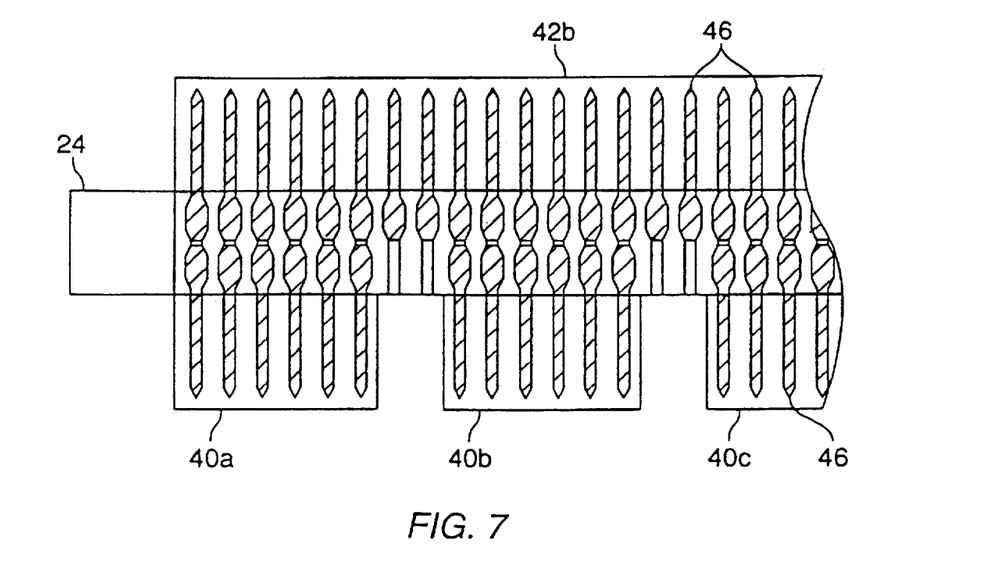
FIG. 7 is a diagram showing a horizontal cross section through the midplane printed-circuit board, several of the switching printed-circuit board connectors, and one of the emulation printed-circuit board connectors, showing an alternate construction technique whereby connection pins may be pressed from both sides of the midplane printed-circuit board into the same drilled hole.

According to an alternate embodiment of the present invention, single-ended connection pins may be press fit from both the first and second faces of midplane printed-circuit board 24. Such an embodiment is illustrated in FIG. 7, a diagram showing a horizontal cross section through the midplane printed-circuit board 24, several of the switching printed-circuit board connectors 42a–42c, and one of the emulation printed circuit board connectors 40b. FIG. 7 shows a how a plurality of single-ended connection pins may be pressed from both sides of the midplane printed-circuit board into the same drilled and plated-through hole. An obvious advantage of the embodiment of FIG. 7 is that only one type of connection pin is needed for the assembly. This technique does not require specially populated connectors as in the other embodiment disclosed herein but does require a thicker midplane and more pins, raising the system cost.

The illustrative hardware emulator embodiment disclosed herein requires a large number of external I/O connections to attach multiple emulators together or to attach the emulator to an external system. As shown in FIG. 1, these external I/O connections come from the switching integrated circuits at the top level. In the emulator, the external I/O connections are made through additional connectors 22 (FIG. 2) placed on the switching printed-circuit boards. The external I/O connectors are located on the opposite edge of the switching printed-circuit boards from the midplane connectors so they are accessible from outside the enclosure. Placing the I/O connectors on the switching printed-circuit boards means that no additional midplane pins or traces are required for external I/O connections.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A printed circuit board interconnect system for hierarchically interconnecting a plurality of logic chips to a plurality of interconnect chips comprising:

a midplane printed circuit board having a plurality of conductive traces;

a plurality of first printed circuit boards, said first printed circuit boards having a plurality of logic chips and a first set of switch chips installed thereon, said first set of switch chips comprising at least one switch chip, each of said plurality of logic chips having a plurality of leads, and each of said first set of switch chips having first and second groups of leads, said first printed circuit boards having circuit traces which connect said leads on a first set of said logic chips to said first group of leads on said first set of switch chips such that each of said first set of switch chips is connected to at least one but not all of said leads on each of said logic chips, said first printed circuit boards installed on a first face of said midplane printed circuit board;

a plurality of second printed circuit boards, said second printed circuit boards having a second set of switch chips installed thereon, said second set of switch chips comprising at least one switch chip, said second printed circuit boards installed on a second face of said midplane printed circuit board in a direction substantially non-parallel to said first printed circuit board;

a first double ended pin disposed through said midplane printed circuit board, said first double ended pin in electrical communication with a first lead of one of said second group of leads on one of said first set of switch chips on a first of said first printed circuit boards, said first double ended pin also in electrical communication with a first lead of one of said second set of switch chips;

a first single ended pin disposed in said midplane printed circuit board and passing through said first face of said midplane printed circuit board, said first single ended pin in electrical communication with a first of said plurality of traces of said midplane printed circuit board, said first trace in electrical communication with a second of said second group of leads on said one of said first set of switch chips on a first of said first printed circuit boards; and a second single ended pin disposed in said midplane printed circuit board and passing through said second face of said midplane printed circuit board, said second single ended pin in electrical communication with a second of said plurality of traces of said midplane printed circuit board, said second trace in electrical communication with a second lead on said one of said second set of switch chips.

2. The system of claim 1 wherein said first set of switch chips are the same type as said second set of switch chips.

3. An electrically reconfigurable logic assembly for use in an electrically reconfigurable hardware emulation system which can be configured with a circuit design in response to the input of circuit information, said electrically reconfigurable assembly comprising:

a midplane printed circuit board having a first face and a second face;

a first and second electrically reconfigurable logic board mounted on said first face of said midplane printed circuit board in a first direction, each of said first and second electrically reconfigurable logic boards comprising a plurality of logic chips installed thereon, each of said logic chips having internal circuitry which can be reprogrammably configured to provide functional elements selected from the group of at least combinational logic elements and sequential logic elements;

a switching board mounted on said second face of said midplane printed circuit board in a second direction, said second direction being substantially non-parallel to said first direction, said at least one switching board comprising a plurality of switch chips installed thereon, said switching board crossing said first and said second logic boards at a first intersection region and a second intersection region;

a first plurality of double ended pins, said first plurality of double ended pins located within said first intersection region, passing through said midplane printed circuit board and extending from said first face and said second face, a first of said first plurality of double ended pins placing a lead of a first of said plurality of logic chips installed on said first electrically reconfigurable logic board in electrical communication with a first lead of a first of said plurality of switch chips installed on said switching board;

a second plurality of double ended pins, said second plurality of double ended pins located within said second intersection region, passing through said midplane printed circuit board and extending from said first face and said second face, a first of said second plurality of double ended pins placing a lead of a second of said plurality of logic chips installed on said second electrically reconfigurable logic board in electrical communication with a second lead of said first of said plurality of switch chips;

a first plurality of single ended pins, said first plurality of single ended pins located between said first and said second intersection region, each of said first plurality of single ended pins extending through said first face of said midplane printed circuit board and being in electrical communication with one of a plurality of corresponding circuit board traces;

a second plurality of single ended pins, said second plurality of single ended pins located adjacent said first intersection region, each of said second plurality of single ended pins extending through said second face of said midplane printed circuit board and being in electrical communication with one of said corresponding circuit board traces; and one of said first plurality of single ended pins placing a lead of a third of said plurality of logic chips installed on said second electrically reconfigurable logic board in electrical communication with a third lead of said first of said plurality of switch chips.

4. An hierarchically interconnected hardware logic emulation apparatus comprising:

a midplane printed-circuit board including a first face and a second face, said second face substantially parallel to said first face, and having a plurality of conductive traces disposed therein;

a plurality of logic boards mounted substantially parallel to one another on said first face of said midplane printed-circuit board, each of said plurality of logic boards comprising:

a plurality of reprogrammable logic chips, each of said reprogrammable logic chips having internal circuitry which can be reprogrammable configured to provide functional elements, each of said reprogrammable logic chips also having programmable input/output terminals which can be reprogrammably connected to said functional elements configured into said reprogrammable logic chips;

each of said plurality of logic boards also comprising a first plurality of reprogrammable switch chips, each of said first plurality of reprogrammable switch chips having a first group of input/output terminals connected to said programmable input/output terminals of each of said reprogrammable logic chips and having internal circuitry which can be reprogrammable configured to provide interconnections between said first group of input/output terminals, each of said first plurality of reprogrammable switch chips also having a second group of input output terminals;

a plurality of switching boards mounted substantially parallel to one another on said second face of said midplane printed-circuit board in a direction substantially perpendicular to said plurality of said logic boards, each of said plurality of switching boards having a second plurality or reprogrammable switch chips installed thereon, each of said plurality of switching boards crossing each of said plurality of logic boards at a plurality of intersection regions, said second plurality of reprogrammable switch chips connected to said group of input/output terminals on said first plurality of reprogrammable switch chips on each of said plurality of logic boards, whereby selected functional elements configured into selected ones of said plurality of logic chips on one of said logic boards can be reconfigurable interconnected to selected functional elements configured into selected ones of said plurality of reprogrammable logic chips one another of said plurality of logic boards;

a plurality of double-ended pins, each of said plurality of double-ended pins extending through said intersection regions of said midplane printed-circuit board, each of said plurality of double ended pins in electrical communication with one of said plurality of logic boards and one of said plurality of switching boards;

a plurality of first single-ended pins, each of said first single-ended pins extending from said first face of said midplane printed-circuit board, each of said plurality of first single-ended pins in electrical communication with one of said plurality of logic boards, each of said plurality of first single-ended pins in electrical contact with at least one of said plurality of conductive traces of said midplane printed-circuit board, said first single-ended pins and said plurality of double ended pins forming a plurality of rows and columns of equidistantly spaced pins on said first face of said midplane printed circuit board; and a plurality of second single-ended pins, each of said plurality of second single-ended pins extending from said second face of said midplane printed-circuit board, each of said plurality of second single-ended pins in electrical communication with one of said plurality of switching boards, each of said of plurality of second single-pine in contact with at least one of said plurality of conductive traces such that a first of said second single-ended pins is in electric contact with a first of said first single-ended pins, said second single-ended pins and said double-ended pins forming a plurality of columns of equidistantly spaced pins on said second face of said midplane printed circuit board.

5. The apparatus of claim 4 wherein said first plurality of reprogrammable switch chips are the same type as said second plurality of reprogrammable switch chips.

6. An electrically reconfigurable logic assembly for use in an electrically reconfigurable hardware emulation system which can be configured with a circuit design in response to the input of circuit information, said electrically reconfigurable assembly comprising:

a midplane printed circuit board having a first face and a second face;

a first and second electrically reconfigurable logic board mounted on said first face of said midplane printed circuit board in a first direction, each of said first and second electrically reconfigurable logic boards comprising a plurality of logic chips installed thereon, each of said logic chips having internal circuitry which can be reprogrammably configured to provide functional elements selected from the group of at least combinational logic elements and sequential logic elements;

a switching board mounted on said second face of said midplane printed circuit board in a second direction, said second direction being substantially non-parallel to said first direction, said at least one switching board comprising at least one switch chip installed thereon, said switching board crossing said first and said second logic boards at a first intersection region and a second intersection region;

a first plurality of double ended pins, said first plurality of double ended pins located within said first intersection region, passing through said midplane printed circuit board and extending from said first face and said second face, a first of said first plurality of double ended pins placing a lead of a first of said plurality of logic chips installed on said first electrically reconfigurable logic board in electrical communication with a first lead on said at least one switch chip installed on said switching board;

a second plurality of double ended pins, said second plurality of double ended pins located within said second intersection region, passing through said midplane printed circuit board and extending from said first face and said second face, a first of said second plurality of double ended pins placing a lead of a second of said plurality of logic chips installed on said second electrically reconfigurable logic board in electrical communication with a second lead of said at least one switch chip;

a first plurality of single ended pins, said first plurality of single ended pins located between said first and said second intersection region, each of said first plurality of single ended pins extending through said first face of said midplane printed circuit board and being in electrical communication with one of a plurality of corresponding circuit board traces;

a second plurality of single ended pins, said second plurality of single ended pins located adjacent said first intersection region, each of said second plurality of single ended pins extending through said second face of said midplane printed circuit board and being in electrical communication with one of said corresponding circuit board traces; and one of said first plurality of single ended pins placing a lead of a third of said plurality of logic chips installed on said second electrically reconfigurable logic board in electrical communication with a third lead of said at least one switch chip.

7. An hierarchically interconnected hardware logic emulation apparatus comprising:

a midplane printed-circuit board including a first face and a second face, said second face substantially parallel to said first face, and having a plurality of conductive traces disposed therein;

a plurality of logic boards mounted substantially parallel to one another on said first face of said midplane printed-circuit board, each of said plurality of logic boards comprising:

a plurality of reprogrammable logic chips, each of said reprogrammable logic chips having internal circuitry which can be reprogrammably configured to provide functional elements, each of said reprogrammable logic chips also having programmable input/output terminals which can be reprogrammably connected to said functional elements configured into said reprogrammable logic chips;

each of said plurality of logic boards also comprising at least one reprogrammable first switch chip, said at least one reprogrammable first switch chip having a first group of input/output terminals connected to said programmable input/output terminals of each of said reprogrammable logic chips and having internal circuitry which can be reprogrammably configured to provide interconnections between said first group of input/output terminals, said at least one reprogrammable first switch chip also having a second group of input output terminals;

a plurality of switching boards mounted substantially parallel to one another on said second face of said midplane printed-circuit board in a direction substantially perpendicular to said plurality of said logic boards, each of said plurality of switching boards having at least one reprogrammable second switch chip installed thereon, each of said plurality of switching boards crossing each of said plurality of logic boards at a plurality of intersection regions, said at least one reprogrammable second switch chip connected to said second group of input/output terminals on said at least one reprogrammable first switch chip on each of said plurality of logic boards, whereby selected functional elements configured into selected ones of said plurality of logic chips on one of said logic boards can be reconfigurably interconnected to selected functional elements configured into selected ones of said plurality of reprogrammable logic chips on another of said plurality of logic boards;

a plurality of double-ended pins, each of said plurality of double-ended pins extending through said intersection regions of said midplane printed-circuit board, each of said plurality of double ended pins in electrical communication with one of said plurality of logic boards and one of said plurality of switching boards;

a plurality of first single-ended pins, each of said first single-ended pins extending from said first face of said midplane printed-circuit board, each of said plurality of first single-ended pins in electrical communication with one of said plurality of logic boards, each of said plurality of first single-ended pins in electrical contact with at least one of said plurality of conductive traces of said midplane printed-circuit board, said first single-ended pins and said plurality of double-ended pins forming a plurality of rows and columns of equidistantly spaced pins on said first face of said midplane printed circuit board; and a plurality of second single-ended pins, each of said plurality of second single-ended pins extending from said second face of said midplane printed-circuit board, each of said plurality of second single-ended pins in electrical communication with one of said plurality of switching boards, each of said plurality of second single-ended pins in contact with at least one of said plurality of conductive traces such that a first of said second single-ended pins is in electric contact with a first of said first single-ended pins, said second single-ended pins and said double-ended pins forming a plurality of columns of equidistantly spaced pins on said second face of said midplane printed circuit board.

8. The logic emulation apparatus of claim 7 wherein said at least one reprogrammable first switch chip is the same type as said at least one reprogrammable second switch chip.

* * * * *